(12) United States Patent
Butzmann et al.

(10) Patent No.: US 10,523,103 B2
(45) Date of Patent: Dec. 31, 2019

(54) METHOD AND DEVICE FOR CONTROLLING POWER SEMICONDUCTOR SWITCHES CONNECTED IN PARALLEL

(71) Applicant: Robert Bosch GmbH, Stuttgart (DE)

(72) Inventors: Stefan Butzmann, Schalksmühle (DE); Bernd Eckert, Vaihingen an der Enz (DE); Peter Taufer, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 196 days.

(21) Appl. No.: 15/531,110

(22) PCT Filed: Sep. 22, 2015

(86) PCT No.: PCT/EP2015/071700
§ 371 (c)(1),
(2) Date: May 26, 2017

(87) PCT Pub. No.: WO2016/082968
PCT Pub. Date: Jun. 2, 2016

(65) Prior Publication Data
US 2017/0272067 A1 Sep. 21, 2017

(30) Foreign Application Priority Data
Nov. 26, 2014 (DE) .......... 10 2014 224 172

(51) Int. Cl.
*B60L 1/00* (2006.01)
*B60L 3/00* (2019.01)
(Continued)

(52) U.S. Cl.
CPC .......... *H02M 1/088* (2013.01); *H03K 17/127* (2013.01); *H03K 17/167* (2013.01); *B60R 16/02* (2013.01); *B60R 16/03* (2013.01)

(58) Field of Classification Search
CPC .. H03K 17/127; H03K 17/133; H03K 17/145; H03K 17/161; H03K 17/164; H02M 1/088
See application file for complete search history.

(56) References Cited

U.S. PATENT DOCUMENTS 7,242,113 B2 * 7/2007 Oumaru .......... H03K 17/08128
307/117
7,906,949 B1 3/2011 Sutardja et al.
(Continued)

FOREIGN PATENT DOCUMENTS

DE 102004006753 1/2005
DE 102010042335 4/2012
(Continued)

OTHER PUBLICATIONS

International Search Report for Application No. PCT/EP2015/071700 dated Dec. 22, 2015 (English Translation, 2 pages).

*Primary Examiner* — Rexford N Barnie
*Assistant Examiner* — Rasem Mourad
(74) *Attorney, Agent, or Firm* — Michael Best & Friedrich LLP (57) ABSTRACT

The invention relates to a method (200) and a control device (I) for controlling at least two power semiconductor switches (LHS1 . . . LHSn) connected in parallel for switching a total current (I_ges). The at least two power semiconductor switches (LHS1 . . . LHSn) connected in parallel each have a gate terminal for controlling the respective power semiconductor switch (LHS1 . . . LHS2). An input terminal (EA) for feeding the total current (I_ges), an output terminal (AA) for discharging the total current (I_ges), and a joint control terminal (S) for receiving a joint control signal (SI) that has the state 'disconnect' or 'connect' are provided. The at least two power semiconductor switches (LHS1 . . . LHSn) connected in parallel are
(Continued)

connected to the input terminal (EA) at an input end and to the output terminal (AA) at the output end.

16 Claims, 2 Drawing Sheets

(51) Int. Cl.
    *H02G 3/00*       (2006.01)
    *H02M 1/088*     (2006.01)
    *H03K 17/12*      (2006.01)
    *H03K 17/16*      (2006.01)
    *B60R 16/02*      (2006.01)
    *B60R 16/03*      (2006.01)

(56) References Cited

U.S. PATENT DOCUMENTS

| | | | | |
|---|---|---|---|---|
| 9,997,989 B2 * | 6/2018 | Butzmann | | H02M 1/088 |
| 2003/0038615 A1 * | 2/2003 | Elbanhawy | | H02M 3/1584 |
| | | | | 323/282 |
| 2003/0214770 A1 * | 11/2003 | Schimanek | | H03K 17/0822 |
| | | | | 361/100 |
| 2012/0098577 A1 * | 4/2012 | Lobsiger | | H02M 1/088 |
| | | | | 327/109 |
| 2013/0257177 A1 * | 10/2013 | Jacobson | | H02M 1/08 |
| | | | | 307/115 |
| 2014/0152280 A1 * | 6/2014 | Spalding, Jr. | | H03K 17/0822 |
| | | | | 323/277 |

FOREIGN PATENT DOCUMENTS

| | | | | |
|---|---|---|---|---|
| DE | 102010042335 A1 * | 4/2012 | | H03K 17/164 |
| EP | 0409384 A2 | 1/1991 | | |
| EP | 0664613 A2 | 7/1995 | | |
| JP | 55136868 A * | 10/1980 | | H02M 3/158 |
| WO | 2011120728 | 10/2011 | | |

* cited by examiner

METHOD AND DEVICE FOR CONTROLLING POWER SEMICONDUCTOR SWITCHES CONNECTED IN PARALLEL

BACKGROUND OF THE INVENTION

The invention relates to a method and a control device for controlling power semiconductor switches connected in parallel. Furthermore, the invention relates to an electrical system comprising the control device, a computer program for carrying out said method, and an electronic storage medium.

Inverters are usually used for operating electrical drives, said inverters converting the electrical energy from a DC voltage source, e.g. a battery, into an AC voltage, in order to supply an electrical machine, e.g. an asynchronous machine, with AC voltage or AC current. The inverter has so-called half-bridges for this purpose. Said half-bridges have power semiconductor switches, by means of which the DC current and the DC voltage are switched in a clocked fashion, such that an AC voltage and an AC current arise at the output terminals of the inverter. Upper limits of current are predefined for said power semiconductor switches, the power semiconductor switches being damaged irreversibly in the event of said upper limits being exceeded. If higher currents are required, then, for the operation of the electrical drive, said power semiconductor switches in the inverters are therefore connected in parallel. On account of component tolerances, however, the power semiconductor switches are loaded to different extents even during parallel operation, since the power semiconductor switches do not switch on simultaneously and, therefore, one of the power semiconductor switches possibly switches on earlier than another. The power semiconductor switch that switches the most rapidly and most sensitively thus bears a greater portion of the switch-on, switch-off and current-conducting losses. Consequently, the current flow between the switches is divided unequally among the power semiconductor switches. Individual power semiconductor switches are thermally loaded to a greater extent than others, age more rapidly and thus fail more rapidly. The maximum load current is therefore determined, if appropriate, by the thermal capacity of individual power semiconductor switches and not by the total current-carrying capacity thereof.

Besides the different switching times of the individual power semiconductor switches connected in parallel, the propagation time differences between the control signals should also be taken into account in the control. One method for minimizing the propagation time differences between the control signals in the control of power semiconductor switches connected in parallel is known from WO 2011/120728 A2.

Therefore, there is a need, for the operation of power semiconductor switches connected in parallel, to develop further solutions that enable a uniform loading of power semiconductor switches connected in parallel. This prevents individual power semiconductor switches from being overloaded and failing prematurely. The robustness of the entire system in which the power semiconductor switches connected in parallel are operated also increases as a consequence.

SUMMARY OF THE INVENTION

A method for controlling at least two power semiconductor switches connected in parallel for switching a total current is provided. The at least two power semiconductor switches connected in parallel each have a gate terminal for controlling the respective power semiconductor switch. The method comprises the following steps: providing an input terminal for feeding the total current, an output terminal for conducting away the total current, and a common control terminal for receiving a common control signal. The control signal has the states open or close. The at least two power semiconductor switches connected in parallel are connected to the input terminal on the input side and to the output terminal on the output side. In a further step, at least one ascertaining unit is provided which receives the common control signal on the input side and ascertains at least two individual control signals depending on the common control signal for controlling the at least two power semiconductor switches and, on the output side, outputs the at least two individual control signals ascertained to the respective gate terminals of the at least two power semiconductor switches. The at least two individual control signals each have the states open or close and, according to the invention, differ at least at times, in particular while the common control signal has the state close.

The method thus serves for controlling power semiconductor switches connected in parallel for switching a total current, in particular in a clocked fashion. Insulated gate bipolar transistors (IGBTs), field effect transistors such as MOSFETs or further conventional power semiconductor switches can be used as power semiconductor switches. The power semiconductor switches usually have a gate terminal. Depending on the electrical potential at the gate terminal, a power semiconductor switches and it establishes an electrical connection between the input terminal and the output terminal; the power semiconductor switch is then closed and in the state close. Alternatively the power semiconductor switch electrically disconnects the input terminal and the output terminal from one another, the power semiconductor switch is then open and in the state open. Furthermore, an ascertaining unit is provided which, on the input side, receives a common control signal for controlling at least two power semiconductor switches connected in parallel. The common control signal has the states open or close. Accordingly, an electrical connection between the input terminal and the output terminal is intended to be disconnected or established by means of the power semiconductor switches. To that end, the ascertaining unit outputs on the output side at least two individual control signals that cause the at least two power semiconductor switches to be controlled at predefinable, in particular different, points in time. To that end, the individual control signals likewise have the states open or close. These states are implemented by the power semiconductor switches controlled by means of the individual control signals. The at least two individual control signals are ascertained by the ascertaining unit depending on the common control signal in such a way that they differ at least at times. An at least partly individual control and an at least partly individual switching of the individual power semiconductors connected in parallel are thus carried out. The power semiconductors connected in parallel at least partly do not switch at a common point in time in accordance with the common control signal, but rather at different successive points in time. In particular, an individual switching is carried out in time segments during which the common control signal has the state close. This is possible since just one closed power semiconductor switch suffices to create an electrical connection between input terminal and output terminal in accordance with the state close of the common control signal. In order to create an electrical disconnection between the input terminal and the output terminal in accordance with the state open of the common control signal, it is necessary, in particular, for all the power semiconductor switches connected in parallel to be opened.

Consequently, a method is advantageously provided which makes it possible for power semiconductor switches connected in parallel to be switched on deliberately at different points in time. This makes it possible for switch-on, switch-off and current-conducting losses not to be distributed arbitrarily over one or a few of the power semiconductor switches connected in parallel, but rather, by means of mutually independent control, for example by means of overlapping control, of the different power semiconductor switches, to be distributed in a targeted manner and, if appropriate, uniformly among the power semiconductor switches connected in parallel. In particular, by means of selection and alternation of the power semiconductors that close or open first, the switch-on and switch-off losses can be distributed in a targeted manner among the individual power semiconductors. By means of varying the temporal duration of the states, in particular of the state close, of the individual control signals, the current-conducting losses can be varied. A method is thus created which enables more uniform distribution of the power among power semiconductor switches connected in parallel during the operation thereof, even if the power semiconductor switches, on account of their component tolerances or their different dimensioning, react to a control signal at different speeds and with different sensitivities. Operation of a parallel circuit comprising power semiconductor switches for example from different batches or wafers or having different structural sizes or powers without singular overloading of a power semiconductor switch, in conjunction with optimum utilization of the performance of all the power semiconductor switches, is thus made possible.

In one configuration of the invention, the at least two individual control signals have the state open or close for different lengths of time.

This means that the power semiconductor switches controlled with the individual control signals have the state open or close for different lengths of time. At the power semiconductor switch which has the state close for a longer time, the current-conducting losses occur for a longer time. This power semiconductor switch is loaded to a greater extent. Advantageously, a method is provided in which one specific power semiconductor can be loaded to a greater extent and another can be loaded to a lesser extent.

In another configuration of the invention, the at least two individual control signals have the same state open or close at least at times.

This control of the power semiconductors results in overlapping operation. The power semiconductors of the power semiconductors connected in parallel are switched on and off at different points in time. The switch-on and switch-off losses are correspondingly borne by different power semiconductor switches. During the overlapping operation, there are time segments in which the at least two power semiconductors simultaneously have the state close. The current-conducting losses are distributed between both power semiconductors within this time segment. Advantageously, a method is provided in which in a targeted manner one or the other of the power semiconductors can be loaded.

In one configuration of the invention, ascertaining the individual control signals is carried out depending on the control signal in such a way that with the change in the control signal from the state open to the state close at least one first of the individual control signals maintains the state open and has the state close only after a first predefinable time has elapsed, and that with the change in the control signal from the state open to the state close, at least one second of the individual control signals has the state close.

That means that depending on a change from the state open to the state close of the control signal, not all of the power semiconductor switches are connected in parallel or controlled, rather for example at least one first individual control signal still has the state open and at least one second of the individual control signals has the state close. The power semiconductor controlled by the at least second individual control signal thus enables the current flow from the input to the output terminal in accordance with the common control signal, whereas the power semiconductor controlled with the at least first individual control signal still remains in the open state. After a first predefinable time has elapsed, the at least first of the individual control signals also has the state close. The power semiconductor controlled with the at least first individual control signal is thus closed in a targeted manner with a time delay with respect to the common control signal. The first predefined time is, in particular, short in comparison with the time duration of the state close of the common control signal. Depending on the specific parameters of the power semiconductor switches used, for example the different loading, speed and sensitivity thereof, the first predefined time can be predefined to be constant but also variable or adaptive depending on the specific parameters ascertained.

Advantageously, the switch-on and current-conducting losses occur in a targeted manner at the initially controlled power semiconductor switches. Significantly lower switch-on and current-conducting losses arise at the power semiconductor switches subsequently switched on, since the current carrying from the input terminal to the output terminal is already undertaken by the power semiconductor switches controlled at the beginning.

In another configuration of the invention, ascertaining the individual control signals is carried out depending on the control signal in such a way that with the change in the control signal from the state close to the state open, the at least first individual control signal maintains the state close and has the state open only after a second predefinable time has elapsed, and that with the change in the control signal from the state close to the state open, the at least second individual control signal has the state open.

That means that depending on a change from the state close to the state open of the control signal, not all of the power semiconductor switches are connected in parallel or controlled, rather for example the at least first individual control signal still has the state close and the at least one second of the individual control signals has the state open. The power semiconductor controlled by the at least second individual control signal thus opens in accordance with the common control signal, whereas the power semiconductor controlled with the at least first individual control signal still remains in the closed state. After a second predefinable time has elapsed, the at least first of the individual control signals also has the state open. The power semiconductor controlled with the at least first individual control signal is thus opened in a targeted manner with a time delay with respect to the common control signal. The second predefined time is, in particular, short in comparison with the time duration of the state close of the common control signal. Depending on the specific parameters of the power semiconductor switches used, for example the different loading, speed and sensitivity thereof, the second predefined time can be predefined to be constant but also variable or adaptive depending on the specific parameters ascertained.

Advantageously, the switch-off and current-conducting losses occur in a targeted manner at the power semiconductor switches that open later. Significantly lower switch-off and current-conducting losses arise at the power semiconductor switches that open previously, since the current carrying from the input terminal to the output terminal is furthermore undertaken by the power semiconductor switches that open later.

In another configuration of the invention, ascertaining the individual control signals is carried out depending on the control signal in such a way that with the change in the control signal from the state close to the state open, the at least second individual control signal maintains the state close and has the state open only after a third predefinable time has elapsed, and that with the change in the control signal from the state close to the state open, the at least first individual control signal has the state open.

That means that depending on a change from the state close to the state open of the control signal, not all of the power semiconductor switches are connected in parallel or controlled, rather for example the at least second individual control signal still has the state close and the at least one first of the individual control signals has the state open. The power semiconductor controlled by the at least first individual control signal thus opens in accordance with the common control signal, whereas the power semiconductor controlled with the at least second individual control signal still remains in the closed state. After a third predefinable time has elapsed, the at least second of the individual control signals also has the state open. The power semiconductor controlled with the at least second individual control signal is thus opened in a targeted manner with a time delay with respect to the common control signal. The third predefined time is, in particular, short in comparison with the time duration of the state close of the common control signal. Depending on the specific parameters of the power semiconductor switches used, for example the different loading, speed and sensitivity thereof, the third predefined time can be predefined to be constant but also variable or adaptive depending on the specific parameters ascertained.

Advantageously, the switch-off and current-conducting losses occur in a targeted manner at the power semiconductor switches that open later. Significantly lower switch-off and current-conducting losses arise at the power semiconductor switches that open previously, since the current carrying from the input terminal to the output terminal is furthermore undertaken by the power semiconductor switches that open later.

In another configuration of the invention, the first and second predefined times or the first and third predefined times are of the same length.

If the first and second predefined times or the first and third predefined times are predefined such that they are of the same length, then the respective switch-on and current-conducting losses or the switch-off and current-conducting losses which occur at the controlled power semiconductor switches during these times are of comparable magnitude.

Advantageously, a method is thus provided which makes it possible, in a targeted manner, to distribute the losses uniformly by means of the individual control signals.

Furthermore, it is possible to influence the magnitude of the individual losses that occur by means of predefining the time duration of the predefined times. A targeted loading or load relieving of selectable power semiconductor switches is thus made possible.

In another configuration of the invention, ascertaining the individual control signals is carried out depending on the control signal in such a way that in the case of successive states close of the control signal, alternately different individual control signals have the states open in an alternating manner. In this case, the alternate individual control signals are selected in particular randomly or according to a fixed order.

That means that the individual control signals are ascertained in such a way that always at least one of the individual control signals which did not already have the state open in the case of the directly preceding state close of the common control signal maintains the state open. By predefining an order in the selection of the alternate individual control signals, a particularly uniform loading of the power semiconductor switches is effected.

This advantageously ensures that all the power semiconductor switches of the power semiconductor switches connected in parallel are loaded more uniformly.

In another configuration of the invention, the loading of the power semiconductor switches is determined and ascertaining an individual control signal for controlling the power semiconductor switch is carried out depending on the respective loading of the power semiconductor switch to be controlled.

That means that the loading of a respective power semiconductor switch or of a subset of the power semiconductor switches connected in parallel is detected and taken into account in ascertaining an individual control signal. The loading of a power semiconductor switch associated with the individual control signal, or of the subset of the power semiconductor switches connected in parallel, is ascertained by an absolute value or else for example a profile, for example of the temperature of a power semiconductor switch, being ascertained. Likewise, a loading can also be ascertained by means of a detection of the power loss which occurs during switching and during operation of the power semiconductor switches. A loading of the power semiconductor switch can also be ascertained from the quantity of energy transmitted by means of the power semiconductor switch as a product of the current and the voltage over time. Other variables can also be cumulated for ascertaining the loading and be taken into account as a correlating variable with the loading or aging of the power semiconductor switch. Determining an individual control signal can furthermore also be carried out depending on a cumulated loading over the entire operating time of one or of a subset of the power semiconductor switches connected in parallel or an aging of the power semiconductor switches connected in parallel, for example by taking account of the integrated temperature profile over the entire operating time of one or of a subset of the power semiconductor switches connected in parallel.

Consequently, a method is advantageously created which enables as uniform aging as possible of the power semiconductor switches by virtue of the fact that the power semiconductor switches loaded the least are always selected and controlled and used for the current carrying of the total current from the input terminal to the output terminal by means of the correspondingly ascertained individual control signal.

In a further configuration of the invention, an individual control signal has the state close if it controls a power semiconductor switch whose loading is lower than a predefinable loading threshold value.

This means that loading threshold values are predefined for the individual power semiconductor switches, or for a subset of the power semiconductor switches connected in parallel. Ascertaining an individual control signal involves firstly checking whether a predefined loading threshold value of a power semiconductor switch has been exceeded. If the loading of a power semiconductor switch is greater than the loading threshold value, the corresponding individual control signal is ascertained in such a way that it has the state open. If an individual control signal has the state close, it controls a power semiconductor switch whose loading is lower than the loading threshold value. The loading threshold values can be determined from experimental temperature measurements on the power semiconductor switches or else on the basis of suitable temperature/power loss models. By suitably varying the duration of the states open and close of the individual power semiconductor switches and by using the power semiconductor switches uniformly, said power semiconductor switches can be operated in accordance with their power loss limit. Even if only one power semiconductor switch is available, current carrying with reduced performance can be established in operation under emergency conditions.

Advantageously, therefore, excessively highly loaded power semiconductor switches are no longer provided for the current carrying of the total current from the input terminal to the output terminal. Destruction of a power semiconductor switch that can be accompanied by a short circuit and hence by a defect of the entire electrical system is avoided.

In another configuration of the invention, a temperature, a power loss, a transmitted quantity of energy or the switching frequency of the power semiconductor switch to be controlled with the individual control signal is taken into account as the loading of a power semiconductor switch.

This means that a loading which is ascertained during the operation of the power semiconductor switches connected in parallel is taken into account. By way of example, this is the temperature of a power semiconductor switch, the detected power loss that occurs during switching and during operation of the power semiconductor switches, the transmitted quantity of energy as a product of the current and the voltage over time, or the switching frequency.

Advantageously, for the method, examples of loadings of a power semiconductor switch are thus provided which make it possible to ascertain or select the individual control signals of the power semiconductor switches with which reliable and operationally safe operation of the power semiconductor switches is made possible.

In another configuration of the invention, the functionality of the power semiconductor switches is determined and, if an individual control signal has the state close, it controls a functional power semiconductor switch.

That means that power semiconductor switches identified as defective from among the power semiconductor switches connected in parallel are not used for the current carrying of the total current from the input terminal to the output terminal. Only individual control signals that control functional power semiconductor switches are output with the state close.

Advantageously, operationally safe operation of the electrical system is thus ensured. In particular, a total failure that may be brought about by short circuits possibly forming is avoided.

In another configuration of the invention, at least partly parallel-connected power semiconductor modules are used as power semiconductor switches connected in parallel, wherein a power semiconductor module comprises power semiconductor switches connected in parallel.

That means that at least partly parallel-connected power semiconductor modules are used instead of individual, individually drivable power semiconductor switches connected in parallel. In this case, a power semiconductor module corresponds to a parallel circuit comprising a plurality of power semiconductor switches whose input, output and control terminals are respectively combined. Such power semiconductor modules are known in various sizes and power classes and are used for current carrying and interruption of higher electrical powers by means of a control signal.

Advantageously, operation of parallel-connected power semiconductor modules is thus made possible in which the individual power semiconductor modules are likewise loaded more uniformly than when all the power semiconductor modules are controlled by means of a control signal and, on account of their component tolerances or their different dimensioning, react to a control signal at different speeds and with different sensitivities. Consequently, advantages comparable to those afforded for the operation of power semiconductor switches connected in parallel are afforded for the operation of the power semiconductor modules connected in parallel.

Furthermore, a control device for controlling at least two power semiconductor switches connected in parallel for switching a total current is provided. The at least two power semiconductor switches (LHS1 . . . LHSn) connected in parallel each have a gate terminal for controlling the respective power semiconductor switch (LHS1 . . . LHSn). The total current is fed via an input terminal and conducted away via an output terminal. The at least two power semiconductor switches connected in parallel are connected to the input terminal on the input side and to the output terminal on the output side. The control device comprises a common control terminal for receiving a common control signal having the states open or close. The control device furthermore comprises at least one ascertaining unit configured to receive the common control signal and to ascertain at least two individual control signals depending on the common control signal for controlling the at least two power semiconductor switches and, on the output side, to output the at least two individual control signals ascertained to the respective gate terminals of the at least two power semiconductor switches. The at least two individual control signals (SI1 . . . SIn) each have the states open or close and, according to the invention, differ at least at times, in particular while the common control signal has the state close.

The ascertaining unit can be embodied here in particular as hardware, for example as a logic module, but also as pure software for controlling corresponding hardware.

The control device thus serves for controlling power semiconductor switches connected in parallel for switching a total current, in particular in a clocked fashion. Furthermore, an ascertaining unit is provided which, on the input side, receives a common control signal for controlling at least two power semiconductor switches connected in parallel. The common control signal has the states open or close, which are intended to be at least partly implemented by the power semiconductor switches. To that end, on the output side, the ascertaining unit outputs at least two individual control signals for controlling the at least two power semiconductor switches at predefinable, in particular different, points in time. To that end, the individual control signals likewise have the states open or close. These states are implemented by the power semiconductor switches controlled by means of the individual control signals. The at least two individual control signals are ascertained by the ascertaining unit depending on the common control signal in such a way that they differ at least at times. An at least partly individual control and an at least partly individual switching of the individual power semiconductors connected in parallel are thus carried out. The power semiconductors connected in parallel at least partly do not switch at a common point in time in accordance with the common control signal, but rather at different successive points in time. In particular, an individual switching is carried out in time segments during which the common control signal has the state close. This is possible since just one closed power semiconductor switch suffices to create an electrical connection between input terminal and output terminal in accordance with the state close of the common control signal. In order to create an electrical disconnection between the input terminal and the output terminal in accordance with the state open of the common control signal, it is necessary, in particular, for all the power semiconductor switches connected in parallel to be opened.

Consequently, a control device is advantageously provided which makes it possible for power semiconductor switches connected in parallel to be switched on deliberately at different points in time. This makes it possible for switch-on, switch-off and current-conducting losses not to be distributed arbitrarily over one or a few of the power semiconductor switches connected in parallel, but rather, by means of mutually independent control, for example by means of alternate control, of the different power semiconductor switches, to be distributed in a targeted manner and, if appropriate, uniformly among the power semiconductor switches connected in parallel. A device is thus created which enables more uniform distribution of the power among power semiconductor switches connected in parallel during the operation thereof, even if the power semiconductor switches, on account of their component tolerances or their different dimensioning, react to a control signal at different speeds and with different sensitivities. Operation of a parallel circuit comprising power semiconductor switches for example from different batches or wafers or having different structural sizes or powers without singular overloading of a power semiconductor switch, in conjunction with optimum utilization of the performance of all the power semiconductor switches, is thus made possible.

Furthermore, an electrical system is provided which comprises an above-described control device and power semiconductor switches connected in parallel for switching a total current within a vehicle.

An electrical system is thus provided which satisfies the requirements within a vehicle and has a high operating safety of power semiconductor switches connected in parallel.

An electrical system is advantageously provided which enables the uniform aging of power semiconductor switches connected in parallel and thus safe operation of the vehicle.

Furthermore, a computer program is provided which is designed to perform all the steps of one of the methods according to the invention.

Furthermore, an electronic storage medium is provided, on which the computer program described is stored.

It goes without saying that the features, properties and advantages of the method according to the invention correspondingly apply or are applicable to the control device according to the invention and/or to the electrical system, and vice versa.

Further features and advantages of embodiments of the invention are evident from the following description with reference to the accompanying drawings.

BRIEF DESCRIPTION OF THE DRAWINGS

The invention will be explained in greater detail below with reference to some figures; for this purpose, in the figures.

DETAILED DESCRIPTION

Figure 1:
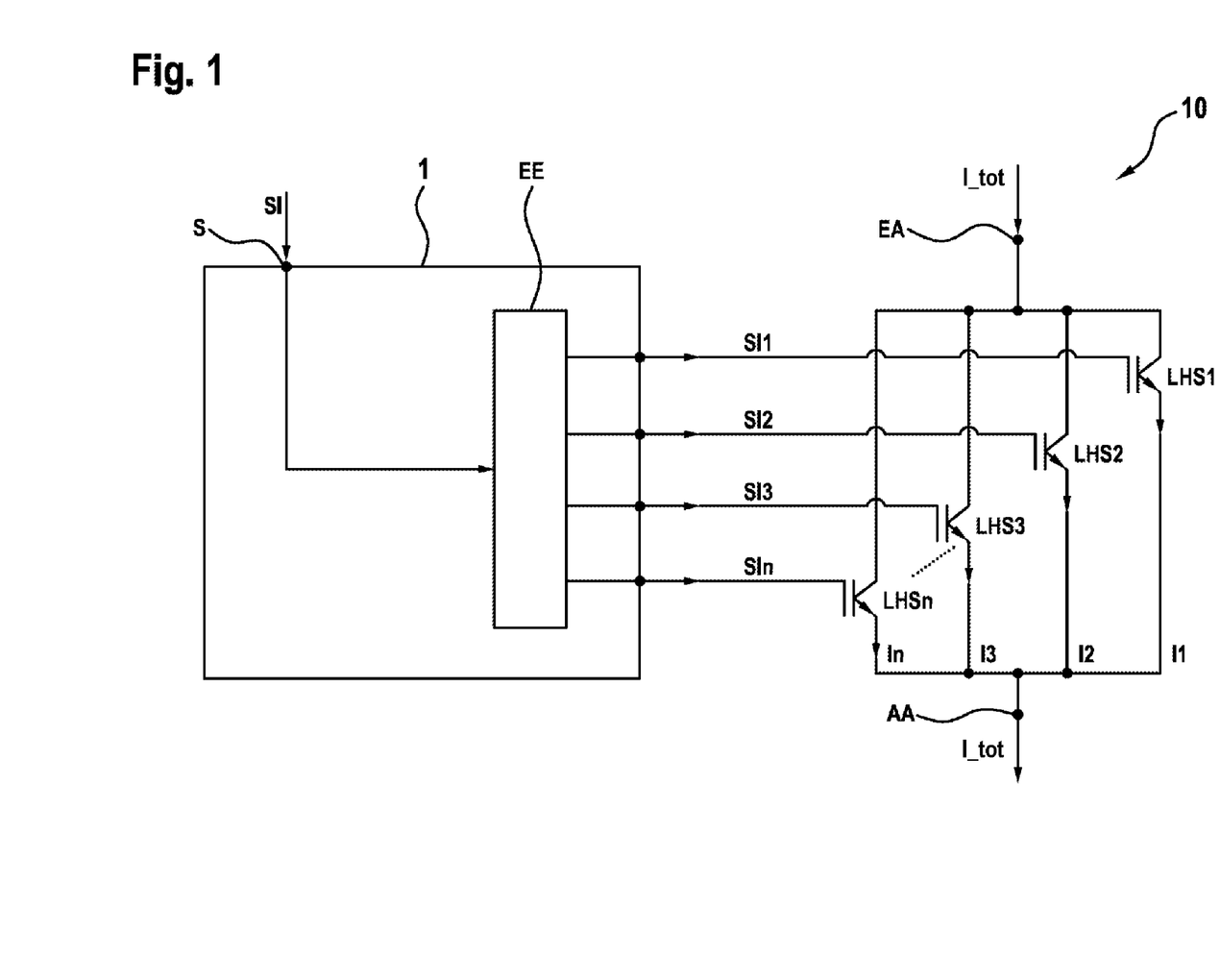
FIG. 1 shows an electrical system comprising a control device in a schematic illustration.

FIG. 1 shows an electrical system 10 in a schematic illustration. A total current I_tot is fed to the electrical system 10 at an input terminal EA. Power semiconductor switches LHS1 . . . LHSn connected in parallel are connected to the input terminal EA on the input side and to the output terminal AA on the output side. The total current I_tot is divided among the power semiconductor switches which are closed, that is to say have the state close. Accordingly, the sum of the individual currents I1 . . . In through the respective power semiconductor LHS1 . . . LHSn connected in parallel always corresponds to the total current I_tot. The total current I_tot is conducted away via the output terminal AA. The power semiconductor switches LHS1 . . . LHSn connected in parallel serve both for current carrying and interruption of the current flow from the input terminal EA to the output terminal AA. The power semiconductor switches LHS1 . . . LHSn connected in parallel each have a gate terminal. The gate terminals among one another are separated from one another, in particular. By way of example, the drawing illustrates that each individual power semiconductor switch has an individual gate terminal. Furthermore, the electrical system 10 comprises a control device 1 having a common control terminal S for receiving a common control signal SI. The control device comprises an ascertaining unit EE, to which the control signal SI is fed. The control signal has the states open or close. The ascertaining unit EE ascertains individual control signals SI1 . . . SIn depending on the control signal SI. The individual control signals (SI1 . . . SIn) each have the states open or close. The individual control signals SI1 . . . SIn are output by the ascertaining unit EE and transmitted to the gate terminals for controlling the power semiconductor switches. This advantageously makes it possible to transmit the common control signal SI over a plurality of mutually independent single individual control signals SI1 . . . SIn. In this regard, for the current carrying of the total current I_tot from the input terminal EA to the output terminal AA, in a targeted manner individual or a subset of the power semiconductor switches LHS1 . . . LHSn connected in parallel can be controlled and used for the current carrying by means of the individual control signals SI1 . . . SIn. The same correspondingly holds true in particular also for the use of power semiconductor modules connected in parallel instead of the power semiconductor switches LHS1 . . . LHSn connected in parallel.

Figure 2:
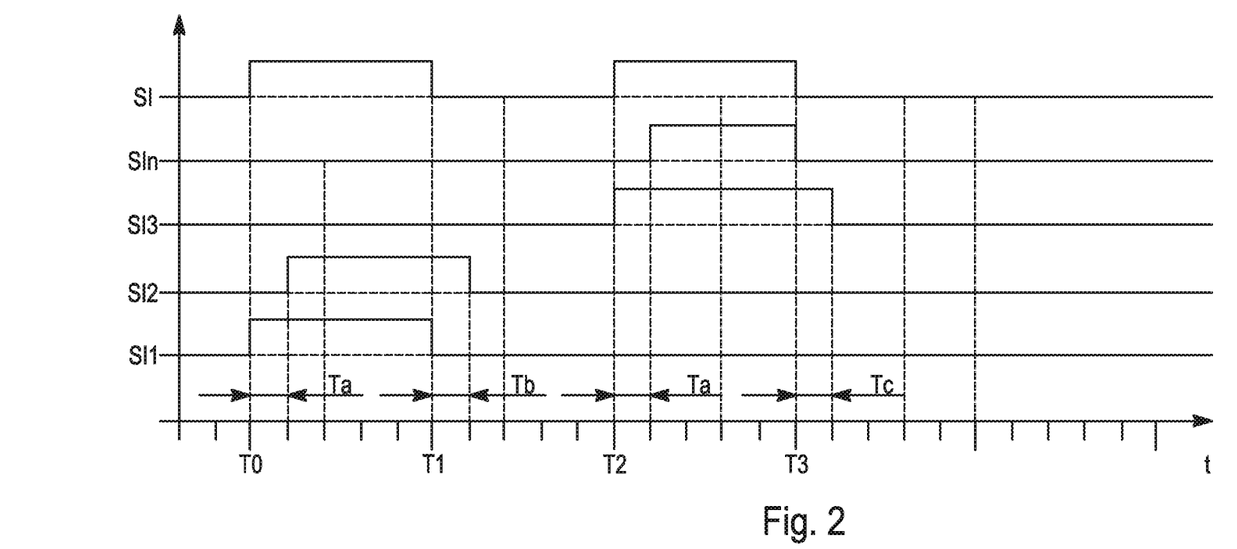
FIG. 2 shows an illustration of the control signals against time.

FIG. 2 shows various control signals plotted against the time axis t. The topmost line reveals the, for example clocked, common control signal SI, which has the state close in each case between the points in time T0 and T1, and T2 and T3 and otherwise has the state open. Depending on the control signal SI, the ascertaining unit EE ascertains individual control signals SI1 . . . SIn. By means of the electrical system 10, at the points in time at which the control signal SI has the state close, the total current I_tot is intended to be passed from the input terminal to the output terminal. FIG. 2 furthermore illustrates by way of example the individual control signals SI1 . . . SIn for overlapping operation of the power semiconductor switches LHS1 . . . LHSn. In this regard, during the first state close of the control signal SI, the individual control signal SI1 likewise has the state close. Consequently, the power semiconductor switch LHS1 is controlled for transmitting the total current. At the point in time T0, the individual control signal SI2 initially maintains the state open. After the first predefined time Ta has elapsed, the individual control signal SI2 also has the state close. The individual control signal SI2 furthermore has the state close until after the point in time T1, at which the state of the control signal SI changes from close to open, and after the subsequent second predefined time Tb has elapsed. In this example, the power semiconductor switch LHS1 accepts the switch-on and current-conducting losses during the first predefined time Ta and the power semiconductor switch LHS2 accepts the switch-off and current-conducting losses during the second predefined time Tb.

Upon the subsequent change in the state of the control signal SI from open to close at the point in time T2, a further power semiconductor switch LHS3 is controlled by means of the individual control signal SI3 with the state close. The power semiconductor switch LHS3 is controlled for transmitting the total current. The individual control signal SIn initially maintains the state open. After a time has elapsed after the point in time T2, in this example once again having the duration of the first predefined time Ta, the individual control signal SIn has the state close. After the point in time T3, at which the state of the control signal SI changes from close to open, the individual control signal SIn has the state open. The individual control signal SI3 furthermore has the state close until after the point in time T3 and the subsequent third predefined time Tc has elapsed. In this example, the power semiconductor switch LHS3 accepts both the switch-on and current-conducting losses during the predefined time Ta and the switch-off and current-conducting losses during the third predefined time Tc. Since, in this example, the switch-on and current-conducting losses during the first predefined time Ta and also the switch-off and current-conducting losses during the third predefined time Tc are distributed over the power semiconductor switch(es) LHS3 controlled with the individual control signal SI3, these power semiconductor switches in this example are loaded to a greater extent than the power semiconductor switches LHSn controlled with the individual control signal SIn. Depending on the choice or ascertainment of the individual control signals, the loading can be distributed among the power semiconductor switches LHS1 . . . LHSn in a targeted manner.

Figure 3:
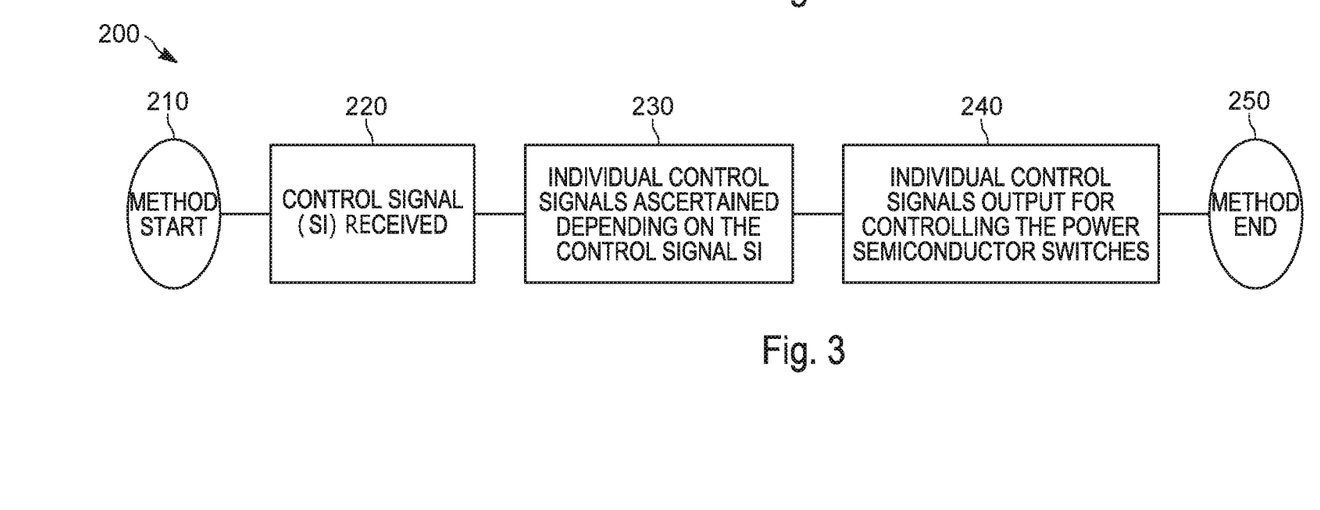
FIG. 3 shows a flow diagram for a method for controlling power semiconductor switches connected in parallel for switching a total current.

FIG. 3 shows a method 200 for controlling power semiconductor switches connected in parallel for switching a total current I_tot. The method starts in step 210. The common control signal SI is received in step 220. In step 230, the individual control signals SI1 . . . SIn are ascertained depending on the control signal SI. In step 240, the individual control signals SI1 . . . SIn are output for controlling the power semiconductor switches. The method ends with step 250.

The invention claimed is:

1. A method (200) for controlling at least two power semiconductor switches (LHS1 . . . LHSn) connected in parallel for switching a total current (I tot), wherein the at least two power semiconductor switches (LHS1 . . . LHSn) connected in parallel each have a gate terminal for controlling the respective power semiconductor switch (LHS1 . . . LHSn), the method comprising:
providing an input terminal (EA) for feeding the total current (I tot), an output terminal (AA) for conducting away the total current (I tot) and a common control terminal (S) for receiving a common control signal (SI) having the states open or close,
wherein the at least two power semiconductor switches (LHS1 . . . LHSn) connected in parallel are connected to the input terminal (EA) on an input side of the input terminal and to the output terminal (AA) on an output side of the output terminal;
providing at least one ascertaining unit (EE) configured to receive the common control signal (SI) on the input side and to ascertain at least two individual control signals (SI1 . . . SIn) depending on the common control signal (SI) for controlling the at least two power semiconductor switches (LHS1 . . . LHSn) and, on the output side, to output the at least two individual control signals ascertained to the respective gate terminals of the at least two power semiconductor switches,
wherein the at least two individual control signals (SI1 . . . SIn) each have the states open or close and the at least two individual control signals (SI . . . SIn) differ at least at times,
wherein after a first time has elapsed, a first of the at least two individual control signals has the state close,
wherein the first time is adaptive based on detected parameters of the semiconductor switch being controlled by the first individual control signal
wherein ascertaining the individual control signals (SI1 . . . SIn) is carried out depending on the common control signal (SI) in such a way that with the change in the common control signal (SI) from the state open to the state close at least one first of the individual control signals (SI1 . . . SIn) maintains the state open and has the state close only after the first time (Ta) has elapsed,
and that with the change in the common control signal (SI) from the state open to the state close, at least one second of the individual control signals (SI1 . . . SIn) has the state close.

2. The method as claimed in claim 1,
wherein the at least two individual control signals (SI1 . . . SIn) have the state open or close for different lengths of time.

3. The method as claimed in claim 1,
wherein the at least two individual control signals (SI1 . . . SIn) have the same state open or close at least at times.

4. The method as claimed in claim 1, wherein ascertaining the individual control signals (SI1 . . . SIn) is carried out depending on the control signal (SI) in such a way that with the change in the control signal (SI) from the state close to the state open, the at least first individual control signal (SI1 . . . SIn) maintains the state close and has the state open only after a second time (Tb) has elapsed, and that with the change in the control signal (SI) from the state close to the state open, the at least second individual control signal (SI1 . . . SIn) has the state open.

5. The method as claimed in claim 1, wherein ascertaining the individual control signals (SI1 . . . SIn) is carried out depending on the control signal (SI) in such a way that with the change in the control signal (SI) from the state close to the state open, the at least second individual control signal (SI1 . . . SIn) maintains the state close and has the state open only after a third time (Tc) has elapsed, and that with the change in the control signal (SI) from the state close to the state open, the at least first individual control signal (SI1 . . . SIn) has the state open.

6. The method as claimed in claim 4,
wherein the first and second times (Ta, Tb) or the first and third times (Ta, Tc) are of the same length.

7. The method as claimed in claim 1,
wherein ascertaining the individual control signals (SI1 . . . SIn) is carried out depending on the control signal (SI) in such a way that in the case of successive states close of the control signal (SI), alternately different individual control signals (SI1 . . . SIn) have the states open in an alternating manner.

8. The method as claimed in claim 1,
wherein the loading of the power semiconductor switches (LHS1 . . . LHSn) is determined and ascertaining an individual control signal (SI1 . . . SIn) is carried out depending on the respective loading of the power semiconductor switch (LHS1 . . . LHSn) to be controlled.

9. The method as claimed in claim 6,
wherein an individual control signal (SI1 . . . SIn) has the state close if it controls a power semiconductor switch (LHS1 . . . LHSn) whose loading is lower than a predefinable loading threshold value.

10. The method as claimed in claim 7,
wherein in order to determine a loading of a power semiconductor switch (LHS1 . . . LHSn), the temperature thereof, the power loss thereof, the transmitted quantity of energy thereof or the switching frequency thereof is taken into account.

11. The method as claimed in claim 1,
wherein the functionality of the power semiconductor switches (LHS1 . . . LHSn) is determined and an individual control signal (SI1 . . . SIn) has the state close if it controls a functional power semiconductor switch (LHS1 . . . LHSn).

12. The method as claimed in claim 1,
wherein at least partly parallel-connected power semiconductor modules are used as power semiconductor switches (LHS1 . . . LHSn) connected in parallel, wherein a power semiconductor module comprises power semiconductor switches (LHS1 . . . LHSn) connected in parallel.

13. A control device (1) for controlling at least two power semiconductor switches (LHS1 . . . LHSn) connected in parallel for switching a total current (I_tot),
wherein the at least two power semiconductor switches (LHS1 . . . LHSn) connected in parallel each have a gate terminal for controlling the respective power semiconductor switch (LHS1 . . . LHSn), and the total current (I tot) is fed via an input terminal (EA) and is conducted away via an output terminal (AA), and the at least two power semiconductor switches (LHS1 . . . LHSn) connected in parallel are connected to the input terminal (EA) on an input side of the input terminal and to the output terminal (AA) on an output side of the output terminal,
the control device comprising:
a common control terminal (S) for receiving a common control signal (SI) having the states open or close, and
at least one ascertaining unit (EE) configured to receive the common control signal (SI) and to ascertain at least two individual control signals (SI1 . . . SIn) depending on the common control signal (SI) for controlling the at least two power semiconductor switches (LHS1 . . . LHSn) and, on the output side, to output the at least two individual control signals ascertained to the respective gate terminals of the at least two power semiconductor switches,
wherein the at least one ascertaining unit is configured to output the at least two individual control signals (SI1 . . . SIn) each having the states open or close,
wherein the at least one ascertaining unit is configured to output and the at least two individual control signals (SI1 . . . SIn) that differ at least at times,
wherein, in response to receiving a transition from the state open to the state close in the common control signal (SI), the at least one ascertaining unit is configured to
output a first individual control signal of the at least two individual control signals (SI1 . . . SIn) having the state close while outputting a second individual control signal of the at least two individual control signals (SI1 . . . SIn) having the state open,
output the second individual control signal of the at least two individual control signals having the state close after a first time has elapsed since receiving the transitions from the state open to the state close in the common control signal (SI),
wherein the at least one ascertaining unit is configured to determine the first time adaptively is adaptive based on detected parameters of the semiconductor switch being controlled by the first individual control signal.

14. An electrical system (10), comprising a control device (1) as claimed in claim 13 and power semiconductor switches (LHS1 . . . LHSn) connected in parallel for switching a total current (I_tot) within a vehicle.

15. A computer program designed to perform all the steps of the methods as claimed in claim 1.

16. A non-transitory computer-readable medium on which the computer program as claimed in claim 15 is stored.

* * * * *